(12) United States Patent
Katkar et al.

(10) Patent No.: US 11,948,847 B2
(45) Date of Patent: Apr. 2, 2024

(54) BONDED STRUCTURES

(71) Applicant: ADEIA SEMICONDUCTOR BONDING TECHNOLOGIES INC., San Jose, CA (US)

(72) Inventors: Rajesh Katkar, San Jose, CA (US); Liang Wang, Milpitas, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 29 days.

(21) Appl. No.: 17/829,185

(22) Filed: May 31, 2022

(65) Prior Publication Data
US 2022/0367302 A1 Nov. 17, 2022

Related U.S. Application Data

(63) Continuation of application No. 16/011,525, filed on Jun. 18, 2018, now Pat. No. 11,380,597.
(Continued)

(51) Int. Cl.
*H01L 23/26* (2006.01)
*B81B 7/00* (2006.01)
(Continued)

(52) U.S. Cl.
CPC ............ *H01L 23/26* (2013.01); *B81B 7/0038* (2013.01); *B81C 3/001* (2013.01);
(Continued)

(58) Field of Classification Search
CPC ....... H01L 23/26; H01L 23/10; H01L 27/085; H01L 24/05; H01L 24/03; H01L 24/09; H01L 21/3221
See application file for complete search history.

(56) References Cited

U.S. PATENT DOCUMENTS 4,998,665 A 3/1991 Hayashi
5,087,585 A 2/1992 Hayashi
(Continued)

FOREIGN PATENT DOCUMENTS

CN 101554988 10/2009
CN 109390305 A 2/2019
(Continued)

OTHER PUBLICATIONS

Amirfeiz et al., "Formation of silicon structures by plasma-activated wafer bonding," Journal of the Electrochemical Society, 2000, vol. 147, No. 7, pp. 2693-2698.
(Continued)

*Primary Examiner* — Jaehwan Oh
*Assistant Examiner* — John M Parker
(74) *Attorney, Agent, or Firm* — Knobbe, Martens, Olson & Bear LLP

(57) ABSTRACT

A bonded structure is disclosed. The bonded structure can include a first element that has a first bonding surface. The bonded structure can further include a second element that has a second bonding surface. The first and second bonding surfaces are bonded to one another along a bonding interface. The bonded structure can also include an integrated device that is coupled to or formed with the first element or the second element. The bonded structure can further include a channel that is disposed along the bonding interface around the integrated device to define an effectively closed profile The bonded structure can also include a getter material that is disposed in the channel. The getter material is configured to reduce the diffusion of gas into an interior region of the bonded structure.

33 Claims, 8 Drawing Sheets

Related U.S. Application Data

(60) Provisional application No. 62/609,683, filed on Dec. 22, 2017.

(51) Int. Cl.
  *B81C 3/00* (2006.01)
  *H01L 21/322* (2006.01)
  *H01L 23/00* (2006.01)
  *H01L 23/04* (2006.01)
  *H01L 23/10* (2006.01)

(52) U.S. Cl.
  CPC .......... *H01L 21/3221* (2013.01); *H01L 23/04* (2013.01); *H01L 23/10* (2013.01); *H01L 24/03* (2013.01); *H01L 24/09* (2013.01)

(56) References Cited

U.S. PATENT DOCUMENTS

| | | | |
|---|---|---|---|
| 5,322,593 | A | 6/1994 | Hasegawa et al. |
| 5,753,536 | A | 5/1998 | Sugiyama et al. |
| 5,771,555 | A | 6/1998 | Eda et al. |
| 5,985,739 | A | 11/1999 | Plettner et al. |
| 5,998,808 | A | 12/1999 | Matsushita |
| 6,008,126 | A | 12/1999 | Leedy |
| 6,080,640 | A | 6/2000 | Gardner et al. |
| 6,265,775 | B1 | 7/2001 | Seyyedy |
| 6,374,770 | B1 | 4/2002 | Lee |
| 6,423,640 | B1 | 7/2002 | Lee et al. |
| 6,465,892 | B1 | 10/2002 | Suga |
| 6,872,984 | B1 | 3/2005 | Leung |
| 6,876,062 | B2 | 4/2005 | Lee et al. |
| 6,887,769 | B2 | 5/2005 | Kellar et al. |
| 6,908,027 | B2 | 6/2005 | Tolchinsky et al. |
| 6,998,712 | B2 | 2/2006 | Okada et al. |
| 7,045,453 | B2 | 5/2006 | Canaperi et al. |
| 7,057,274 | B2 | 6/2006 | Heschel |
| 7,078,811 | B2 | 7/2006 | Suga |
| 7,105,980 | B2 | 9/2006 | Abbott et al. |
| 7,193,423 | B1 | 3/2007 | Dalton et al. |
| 7,354,798 | B2 | 4/2008 | Pogge et al. |
| 7,359,591 | B2 | 4/2008 | Vandentop et al. |
| 7,388,281 | B2 | 6/2008 | Krueger et al. |
| 7,467,897 | B2 | 12/2008 | Hauffe et al. |
| 7,622,324 | B2 | 11/2009 | Enquist et al. |
| 7,750,488 | B2 | 7/2010 | Patti et al. |
| 7,803,693 | B2 | 9/2010 | Trezza |
| 7,972,683 | B2 | 7/2011 | Gudeman et al. |
| 8,183,127 | B2 | 5/2012 | Patti et al. |
| 8,191,756 | B2 | 6/2012 | Coppeta et al. |
| 8,241,961 | B2 | 8/2012 | Kim et al. |
| 8,269,671 | B2 | 9/2012 | Chen et al. |
| 8,314,007 | B2 | 11/2012 | Vaufredaz |
| 8,349,635 | B1 | 1/2013 | Gan et al. |
| 8,357,931 | B2 | 1/2013 | Schieck et al. |
| 8,377,798 | B2 | 2/2013 | Peng et al. |
| 8,395,229 | B2 | 3/2013 | Garcia-Blanco et al. |
| 8,411,444 | B2 | 4/2013 | Gaynes et al. |
| 8,441,131 | B2 | 5/2013 | Ryan |
| 8,476,146 | B2 | 7/2013 | Chen et al. |
| 8,476,165 | B2 | 7/2013 | Trickett et al. |
| 8,482,132 | B2 | 7/2013 | Yang et al. |
| 8,501,537 | B2 | 8/2013 | Sadaka et al. |
| 8,524,533 | B2 | 9/2013 | Tong et al. |
| 8,530,997 | B1 | 9/2013 | Yang et al. |
| 8,546,928 | B2 | 10/2013 | Merz et al. |
| 8,620,164 | B2 | 12/2013 | Heck et al. |
| 8,647,987 | B2 | 2/2014 | Yang et al. |
| 8,669,602 | B2 | 3/2014 | Hayashi |
| 8,697,493 | B2 | 4/2014 | Sadaka |
| 8,716,105 | B2 | 5/2014 | Sadaka et al. |
| 8,802,538 | B1 | 8/2014 | Liu |
| 8,809,123 | B2 | 8/2014 | Liu et al. |
| 8,841,002 | B2 | 9/2014 | Tong |
| 8,916,448 | B2 | 12/2014 | Cheng et al. |
| 8,988,299 | B2 | 3/2015 | Kam et al. |
| 9,093,350 | B2 | 7/2015 | Endo et al. |
| 9,119,313 | B2 | 8/2015 | Zhang et al. |
| 9,142,517 | B2 | 9/2015 | Liu et al. |
| 9,142,532 | B2 | 9/2015 | Suga et al. |
| 9,171,756 | B2 | 10/2015 | Enquist et al. |
| 9,184,125 | B2 | 11/2015 | Enquist et al. |
| 9,224,704 | B2 | 12/2015 | Landru |
| 9,230,941 | B2 | 1/2016 | Chen et al. |
| 9,257,399 | B2 | 2/2016 | Kuang et al. |
| 9,299,736 | B2 | 3/2016 | Chen et al. |
| 9,312,229 | B2 | 4/2016 | Chen et al. |
| 9,318,471 | B2 | 4/2016 | Kabe et al. |
| 9,337,235 | B2 | 5/2016 | Chen et al. |
| 9,368,866 | B2 | 6/2016 | Yu |
| 9,385,024 | B2 | 7/2016 | Tong et al. |
| 9,386,688 | B2 | 7/2016 | MacDonald et al. |
| 9,391,143 | B2 | 7/2016 | Tong et al. |
| 9,394,161 | B2 | 7/2016 | Cheng et al. |
| 9,431,368 | B2 | 8/2016 | Enquist et al. |
| 9,437,572 | B2 | 9/2016 | Chen et al. |
| 9,443,796 | B2 | 9/2016 | Chou et al. |
| 9,461,007 | B2 | 10/2016 | Chun et al. |
| 9,496,239 | B1 | 11/2016 | Edelstein et al. |
| 9,536,848 | B2 | 1/2017 | England et al. |
| 9,559,081 | B1 | 1/2017 | Lai et al. |
| 9,601,454 | B2 | 3/2017 | Zhao et al. |
| 9,620,464 | B2 | 4/2017 | Baks et al. |
| 9,620,481 | B2 | 4/2017 | Edelstein et al. |
| 9,656,852 | B2 | 5/2017 | Cheng et al. |
| 9,723,716 | B2 | 8/2017 | Meinhold |
| 9,728,521 | B2 | 8/2017 | Tsai et al. |
| 9,741,620 | B2 | 8/2017 | Uzoh et al. |
| 9,768,307 | B2 | 9/2017 | Yamazaki et al. |
| 9,799,587 | B2 | 10/2017 | Fujii et al. |
| 9,834,435 | B1 | 12/2017 | Liu et al. |
| 9,852,988 | B2 | 12/2017 | Enquist et al. |
| 9,881,882 | B2 | 1/2018 | Hsu et al. |
| 9,893,004 | B2 | 2/2018 | Yazdani |
| 9,899,442 | B2 | 2/2018 | Katkar |
| 9,929,050 | B2 | 3/2018 | Lin |
| 9,941,241 | B2 | 4/2018 | Edelstein et al. |
| 9,941,243 | B2 | 4/2018 | Kim et al. |
| 9,953,941 | B2 | 4/2018 | Enquist |
| 9,960,142 | B2 | 5/2018 | Chen et al. |
| 10,002,844 | B1 | 6/2018 | Wang et al. |
| 10,026,605 | B2 | 7/2018 | Doub et al. |
| 10,075,657 | B2 | 9/2018 | Fahim et al. |
| 10,204,893 | B2 | 2/2019 | Uzoh et al. |
| 10,269,756 | B2 | 4/2019 | Uzoh |
| 10,276,619 | B2 | 4/2019 | Kao et al. |
| 10,276,909 | B2 | 4/2019 | Huang et al. |
| 10,418,277 | B2 | 9/2019 | Cheng et al. |
| 10,446,456 | B2 | 10/2019 | Shen et al. |
| 10,446,487 | B2 | 10/2019 | Huang et al. |
| 10,446,532 | B2 | 10/2019 | Uzoh et al. |
| 10,508,030 | B2 | 12/2019 | Katkar et al. |
| 10,522,499 | B2 | 12/2019 | Enquist et al. |
| 10,615,133 | B2 | 4/2020 | Kamgaing et al. |
| 10,658,312 | B2 | 5/2020 | Kamgaing et al. |
| 10,707,087 | B2 | 7/2020 | Uzoh et al. |
| 10,727,219 | B2 | 7/2020 | Uzoh et al. |
| 10,784,191 | B2 | 9/2020 | Huang et al. |
| 10,790,262 | B2 | 9/2020 | Uzoh et al. |
| 10,840,135 | B2 | 11/2020 | Uzoh |
| 10,840,205 | B2 | 11/2020 | Fountain, Jr. et al. |
| 10,854,578 | B2 | 12/2020 | Morein |
| 10,879,212 | B2 | 12/2020 | Uzoh et al. |
| 10,886,177 | B2 | 1/2021 | DeLaCruz et al. |
| 10,892,246 | B2 | 1/2021 | Uzoh |
| 10,923,408 | B2 | 2/2021 | Huang et al. |
| 10,923,413 | B2 | 2/2021 | DeLaCruz |
| 10,950,547 | B2 | 3/2021 | Mohammed et al. |
| 10,964,664 | B2 | 3/2021 | Mandalapu et al. |
| 10,985,133 | B2 | 4/2021 | Uzoh |
| 10,991,804 | B2 | 4/2021 | DeLaCruz et al. |
| 10,998,292 | B2 | 5/2021 | Lee et al. |
| 11,004,757 | B2 | 5/2021 | Katkar et al. |
| 11,011,503 | B2 | 5/2021 | Wang et al. |

(56) References Cited

U.S. PATENT DOCUMENTS

| | | |
|---|---|---|
| 11,031,285 B2 | 6/2021 | Katkar et al. |
| 11,056,348 B2 | 7/2021 | Theil |
| 11,088,099 B2 | 8/2021 | Katkar et al. |
| 11,127,738 B2 | 9/2021 | DeLaCruz et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,205,600 B2 | 12/2021 | Shen et al. |
| 11,256,004 B2 | 2/2022 | Haba et al. |
| 11,257,727 B2 | 2/2022 | Katkar et al. |
| 11,264,357 B1 | 3/2022 | DeLaCruz et al. |
| 11,276,676 B2 | 3/2022 | Enquist et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,380,597 B2 | 7/2022 | Katkar et al. |
| 11,417,576 B2 | 8/2022 | Katkar et al. |
| 11,485,670 B2 | 11/2022 | Ruben et al. |
| 11,600,542 B2 | 3/2023 | Huang et al. |
| 11,670,615 B2 | 6/2023 | Wang et al. |
| 2002/0000328 A1 | 1/2002 | Motomura et al. |
| 2002/0003307 A1 | 1/2002 | Suga |
| 2002/0094608 A1 | 7/2002 | Brooks |
| 2002/0179921 A1 | 12/2002 | Cohr |
| 2003/0098060 A1 | 5/2003 | Yoshimi |
| 2004/0084414 A1 | 5/2004 | Sakai et al. |
| 2004/0259325 A1 | 12/2004 | Gan |
| 2005/0009246 A1 | 1/2005 | Enquist et al. |
| 2005/0082653 A1 | 4/2005 | McWilliams et al. |
| 2005/0263866 A1 | 12/2005 | Wan |
| 2006/0001123 A1 | 1/2006 | Heck et al. |
| 2006/0057945 A1 | 3/2006 | Hsu et al. |
| 2006/0097335 A1 | 5/2006 | Kim et al. |
| 2006/0115323 A1 | 6/2006 | Coppeta et al. |
| 2006/0197215 A1 | 9/2006 | Potter |
| 2006/0208326 A1 | 9/2006 | Nasiri et al. |
| 2007/0029562 A1 | 2/2007 | Koizumi |
| 2007/0045781 A1 | 3/2007 | Carlson et al. |
| 2007/0045795 A1 | 3/2007 | McBean |
| 2007/0096294 A1 | 5/2007 | Ikeda et al. |
| 2007/0111386 A1 | 5/2007 | Kim et al. |
| 2007/0134891 A1 | 6/2007 | Adetutu et al. |
| 2007/0188054 A1 | 8/2007 | Hasken et al. |
| 2007/0222048 A1 | 9/2007 | Huang |
| 2007/0295456 A1 | 12/2007 | Gudeman et al. |
| 2008/0080832 A1 | 4/2008 | Chen et al. |
| 2008/0124835 A1 | 5/2008 | Chen et al. |
| 2008/0283995 A1 | 11/2008 | Bucki et al. |
| 2008/0290490 A1 | 11/2008 | Fujii et al. |
| 2008/0296709 A1 | 12/2008 | Haba et al. |
| 2009/0053855 A1 | 2/2009 | Summers |
| 2009/0186446 A1 | 7/2009 | Kwon et al. |
| 2009/0267165 A1 | 10/2009 | Okudo et al. |
| 2010/0078786 A1 | 4/2010 | Maeda |
| 2010/0096713 A1 | 4/2010 | Jung |
| 2010/0148341 A1 | 6/2010 | Fuji et al. |
| 2010/0181676 A1 | 7/2010 | Montez et al. |
| 2010/0288525 A1 | 11/2010 | Basavanhally et al. |
| 2010/0301432 A1 | 12/2010 | Kittilsland et al. |
| 2011/0031633 A1 | 2/2011 | Hsu et al. |
| 2011/0115092 A1 | 5/2011 | Tago |
| 2011/0147859 A1 | 6/2011 | Tanaka et al. |
| 2011/0156242 A1 | 6/2011 | Sakaguchi et al. |
| 2011/0180921 A1 | 7/2011 | Loiselet |
| 2011/0290552 A1 | 12/2011 | Palmateer et al. |
| 2012/0061776 A1 | 3/2012 | Cheng et al. |
| 2012/0097733 A1 | 4/2012 | Ebefors et al. |
| 2012/0100657 A1 | 4/2012 | Di Cioccio et al. |
| 2012/0112335 A1 | 5/2012 | Ebefors et al. |
| 2012/0142144 A1 | 6/2012 | Taheri |
| 2012/0212384 A1 | 8/2012 | Kam et al. |
| 2012/0267730 A1 | 10/2012 | Renard et al. |
| 2012/0286380 A1 | 11/2012 | Yazdi et al. |
| 2012/0326248 A1 | 12/2012 | Daneman et al. |
| 2013/0099331 A1 | 4/2013 | Chen et al. |
| 2013/0122702 A1 | 5/2013 | Volant et al. |
| 2013/0187245 A1 | 7/2013 | Chien et al. |
| 2013/0271066 A1 | 10/2013 | Signorelli et al. |
| 2013/0277774 A1 | 10/2013 | Frey et al. |
| 2013/0277777 A1 | 10/2013 | Chang et al. |
| 2013/0293428 A1 | 11/2013 | Souriau et al. |
| 2014/0042593 A1* | 2/2014 | Mauder ............... H01L 29/7395 438/561 |
| 2014/0175655 A1 | 6/2014 | Chen et al. |
| 2014/0197534 A1 | 7/2014 | Partosa et al. |
| 2014/0217557 A1 | 8/2014 | Chen et al. |
| 2014/0225206 A1 | 8/2014 | Lin et al. |
| 2014/0225795 A1 | 8/2014 | Yu |
| 2014/0264653 A1 | 9/2014 | Cheng et al. |
| 2014/0361413 A1 | 12/2014 | Chapelon |
| 2015/0001632 A1 | 1/2015 | Liu et al. |
| 2015/0064498 A1 | 3/2015 | Tong |
| 2015/0068666 A1 | 3/2015 | Abe et al. |
| 2015/0091153 A1 | 4/2015 | Liu et al. |
| 2015/0097215 A1 | 4/2015 | Chu et al. |
| 2015/0137345 A1 | 5/2015 | Choi et al. |
| 2015/0298965 A1 | 10/2015 | Tsai et al. |
| 2015/0336790 A1 | 11/2015 | Geen et al. |
| 2015/0336792 A1 | 11/2015 | Huang et al. |
| 2016/0002029 A1 | 1/2016 | Nasiri et al. |
| 2016/0107881 A1 | 4/2016 | Thompson et al. |
| 2016/0137492 A1 | 5/2016 | Cheng et al. |
| 2016/0146851 A1 | 5/2016 | Kamisuki |
| 2016/0229685 A1 | 8/2016 | Boysel |
| 2016/0240495 A1 | 8/2016 | Lachner et al. |
| 2016/0318757 A1 | 11/2016 | Chou et al. |
| 2016/0343682 A1 | 11/2016 | Kawasaki |
| 2017/0001858 A1 | 1/2017 | Adams et al. |
| 2017/0008757 A1 | 1/2017 | Cheng et al. |
| 2017/0062366 A1 | 3/2017 | Enquist |
| 2017/0081181 A1 | 3/2017 | Zhang et al. |
| 2017/0137281 A1 | 5/2017 | Favier et al. |
| 2017/0186732 A1 | 6/2017 | Chu et al. |
| 2017/0194271 A1 | 7/2017 | Hsu et al. |
| 2017/0200711 A1 | 7/2017 | Uzoh et al. |
| 2017/0305738 A1 | 10/2017 | Chang et al. |
| 2017/0338214 A1 | 11/2017 | Uzoh et al. |
| 2018/0044175 A1 | 2/2018 | Ogashiwa et al. |
| 2018/0047682 A1 | 2/2018 | Chang et al. |
| 2018/0096931 A1 | 4/2018 | Huang et al. |
| 2018/0174995 A1 | 6/2018 | Wang et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0191047 A1 | 7/2018 | Huang et al. |
| 2018/0219038 A1 | 8/2018 | Gambino et al. |
| 2018/0269161 A1 | 9/2018 | Wu et al. |
| 2018/0273377 A1 | 9/2018 | Katkar et al. |
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0337157 A1 | 11/2018 | Wang et al. |
| 2019/0051628 A1 | 2/2019 | Liu et al. |
| 2019/0096741 A1 | 3/2019 | Uzoh et al. |
| 2019/0115277 A1 | 4/2019 | Yu et al. |
| 2019/0131277 A1 | 5/2019 | Yang et al. |
| 2019/0164914 A1 | 5/2019 | Hu et al. |
| 2019/0198407 A1 | 6/2019 | Huang et al. |
| 2019/0265411 A1 | 8/2019 | Huang et al. |
| 2019/0333550 A1 | 10/2019 | Fisch |
| 2019/0348336 A1 | 11/2019 | Katkar et al. |
| 2019/0363079 A1 | 11/2019 | Thei et al. |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0043817 A1 | 2/2020 | Shen et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |

(56) References Cited

U.S. PATENT DOCUMENTS

| | | |
|---|---|---|
| 2020/0118973 A1 | 4/2020 | Wang et al. |
| 2020/0126906 A1 | 4/2020 | Uzoh et al. |
| 2020/0131028 A1 | 4/2020 | Cheng et al. |
| 2020/0140267 A1 | 5/2020 | Katkar et al. |
| 2020/0140268 A1 | 5/2020 | Katkar et al. |
| 2020/0144217 A1 | 5/2020 | Enquist et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0098412 A1 | 4/2021 | Haba et al. |
| 2021/0118864 A1 | 4/2021 | DeLaCruz et al. |
| 2021/0134689 A1 | 5/2021 | Huang et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0202428 A1 | 7/2021 | Wang et al. |
| 2021/0242152 A1 | 8/2021 | Fountain, Jr. et al. |
| 2021/0265227 A1 | 8/2021 | Katkar et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2022/0415734 A1 | 12/2022 | Katkar et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0260858 A1 | 8/2023 | Huang et al. |
| 2023/0268300 A1 | 8/2023 | Uzoh et al. |
| 2023/0343734 A1 | 10/2023 | Uzoh et al. |
| 2023/0360950 A1 | 11/2023 | Gao |
| 2023/0361072 A1 | 11/2023 | Wang et al. |
| 2023/0361074 A1 | 11/2023 | Uzoh et al. |
| 2023/0369136 A1 | 11/2023 | Uzoh et al. |
| 2023/0375613 A1 | 11/2023 | Haba et al. |

FOREIGN PATENT DOCUMENTS

| | | |
|---|---|---|
| EP | 2813465 A1 | 12/2014 |
| JP | H10-112517 | 4/1998 |
| JP | 2000-100679 | 4/2000 |
| JP | 2001-102479 | 4/2001 |
| JP | 2001-148436 | 5/2001 |
| JP | 2002-353416 | 12/2002 |
| JP | 2008-130915 | 6/2008 |
| JP | 2009-039843 | 2/2009 |
| JP | 2009-238905 | 10/2009 |
| JP | 2010-199608 | 9/2010 |
| JP | 2011-131309 | 7/2011 |
| JP | 2013-33786 | 2/2013 |
| JP | 2013-513227 | 4/2013 |
| JP | 2013-243333 | 12/2013 |
| JP | 2014-219321 | 11/2014 |
| JP | 2015-100886 | 6/2015 |
| JP | 2015-153791 | 8/2015 |
| JP | 2016-099224 | 5/2016 |
| JP | 2018-160519 | 10/2018 |
| KR | 10-2005-0101324 | 10/2005 |
| KR | 10-2015-0097798 | 8/2015 |
| KR | 10-2017-0108143 | 9/2017 |
| TW | 201210098 A1 | 3/2012 |
| TW | I533399 B | 5/2016 |
| WO | WO 2005/043584 A2 | 5/2005 |
| WO | WO 2006/100444 A1 | 9/2006 |
| WO | WO 2007/103224 A2 | 9/2007 |
| WO | WO 2012/130730 A1 | 10/2012 |
| WO | WO 2014-074403 A1 | 5/2014 |
| WO | WO 2017/100256 A1 | 6/2017 |
| WO | WO 2017/151442 A1 | 9/2017 |

OTHER PUBLICATIONS

Beer et al., "Coplanar 122GHz Antenna Array With Air Cavity Reflector for Integration in Plastic Packages", IEEE Antennas and Wireless Propagation Letters, 11:160-163, Jan. 2012.

Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding method," Applied Surface Science, Jun. 2, 1997, vols. 117-118, pp. 808-812.

Daneman, "Applying the CMOS Test Flow to MEMS Manufacturing", InvenSense, Inc., accessed on Apr. 5, 2020.

Farrens et al., "Chemical free room temperature wafer to wafer direct bonding," J. Electrochem. Soc., The Electrochemical Society, Inc., Nov. 1995, vol. 142, No. 11. pp. 3949-3955.

Farrens et al., "Chemical free wafer bonding of silicon to glass and sapphire," Electrochemical Society Proceedings vol. 95-7, 1995, pp. 72-77.

Gösele et al., "Semiconductor Wafer Bonding: A flexible approach to materials combinations in microelectronics; micromechanics and optoelectronics," IEEE, 1997, pp. 23-32.

Gu et al., "A Multilayer Organic Package with 64 Dual-Polarized Antennas for 28GHz 5G Communication", IBM Research, pp. 1-3, 2017.

Hosoda et al., "Effect of the surface treatment on the room-temperature bonding of Al to Si and SiO2," Journal of Materials Science, Jan. 1, 1998, vol. 33, Issue 1, pp. 253-258.

(56) References Cited

OTHER PUBLICATIONS

Hosoda et al., "Room temperature GaAs—Si and InP—Si wafer direct bonding by the surface activated bonding method," Nuclear Inst. and Methods in Physics Research B, 1997, vol. 121, Nos. 1-4, pp. 203-206.
Howlader et al., "A novel method for bonding of ionic wafers," Electronics Components and Technology Conference, 2006, IEEE, pp. 7-pp.
Howlader et al., "Bonding of p-Si/n-InP wafers through surface activated bonding method at room temperature," Indium Phosphide and Related Materials, 2001, IEEE International Conference on, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
Inertial MEMS Manufacturing Trends 2014 Report by Yole Developpement Sample Report, Slide 11, https://www.slideshare.net/Yole_Developpement/yole-inertial-memsmanufacturingtrends2014sample.
International Search Report and Written Opinion dated Apr. 13, 2018 in International Application No. PCT/US2017/067742, 14 pages.
International Search Report and Written Opinion dated Apr. 16, 2018 in International Application No. PCT/US2017/067741, 17 pages.
International Search Report and Written Opinion dated May 31, 2018 in International Application No. PCT/US2018/022688, 2 pages.
International Search Report and Written Opinion dated Mar. 7, 2019, in International Application No. PCT/US2018/060044, 14 pages.
International Search Report and Written Opinion dated Apr. 22, 2019 in International Application No. PCT/US2018/064982, 13 pages.
International Search Report and Written Opinion dated Aug. 26, 2019 in International Application No. PCT/US2019/031113, 14 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—Cu, Cu—Si, and Cu—SiO2 at low temperature," Proceedings—Electrochemical Society, 2003, vol. 19, pp. 239-247.
Matsuzawa et al., "Room-temperature interconnection of electroplated Au microbump by means of surface activated bonding method," Electornic Components and Technology Conference, 2001, 51st Proceedings, IEEE, pp. 384-387.
Moriceau, H. et al., "Overview of recent direct wafer bonding advances and applications," Advances in Natural Sciences—Nanoscience and Nanotechnology, 2010, 11 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Norton, Francis, "Permeation of gases through solids," Journal of Applied Physics, Jan. 1957, vol. 28, No. 1.
Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(l), 6 pages.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Plobi, A. et al., "Wafer direct bonding: tailoring adhesion between brittle materials," Materials Science and Engineering Review Journal, 1999, R25, 88 pages.
Reiche et al., "The effect of a plasma pretreatment on the Si/Si bonding behaviouir," Electrochemical Society Proceedings, 1998, vol. 97-36, pp. 437-444.
Roberds et al., "Low temperature , in situ, plasma activated wafer bonding," Electrochecmical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.

(56) References Cited

OTHER PUBLICATIONS

Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room-temperature bonding of lithium niobate and silicon wafers by argon-beam surface activation," Appl. Phys. Lett., 1999. vol. 74, pp. 2387.
Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al, "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectomechanical systems, Mar. 1994, vol. 3, No. 1, pp. 29-35.
Topol et al., "Enabling technologies for wafer-level bonding of 3D MEMS and integrated circuit structures," 2004 Electronics Components and Technology Conference, 2004 IEEE, pp. 931-938.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Xu et al., "New Au—Al interconnect technology and its reliability by surface activated bonding," Electronic Packaging Technology Proceedings, Oct. 28-30, 2003, Shanghai, China, pp. 479-483.
Zhang et al., "Antenna-on-Chip and Antenna-in-Package Solutions to Highly Integrated Millimeter-Wave Devices for Wireless Communications", IEEE Transactions on Antennas and Propagation, 57(10):2830-2841, Oct. 2009.
Zhou et al., "A Wideband Circularly Polarized Patch Antenna for 60 GHz Wireless Communications", Wireless Engineering and Technology, 3:97-105, 2012.
Zoschke, K. et al., "Hermetic wafer level packaging of MEMS components using through silicon via and wafer to wafer bonding technologies," 2013 Electronic Components & Technology Conference, 2013 IEEE, pp. 1500-1507.
"The Advantages of Integrated MEMS to Enable the Internet of Moving Things", mCube, White Paper Jan. 2018.
Ceramic Microstructures: Control at the Atomic Level, Recent Progress in Surface Activated Bonding, 1998, pp. 385-389.
Android Wiki, "Samsung Galaxy S2," indicating that the Samsung Galaxy S2 was unveiled on Feb. 13, 2011 at the Mobile World Congress (MWC) in Barcelona, https://android.fandom.com/wiki/Samsung_Galaxy_S2 (downloaded Nov. 20, 2023).
Bush, Steve, "Electronica: Automotive power modules from On Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).
GADGETS360, "Sony Xperia S," indicating that the Sony Xperia LT26i product was released on Feb. 12, 2012, https://www.gadgets360.com/sony-xperia-s-609 (downloaded Nov. 20, 2023).
Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.
Omnivision OV20880 image, cross section of Omnivision product labeled OV20880, showing a hybrid bonded back side illuminated CMOS image sensor device with a pad opening to expose an aluminum bond pad. The part in the image was received on Sep. 24, 2021. Applicant makes no representation that the part in the image is identical to the part identified in the separately submitted reference Omnivision Technologies, Inc. in PR Newswire ("PR Newswire article"); however the imaged part and the part shown in the PR Newsire article share the part name "OV20880."
OmniVision Technologies, Inc., "OmniVision Announces New Family of 20-Megapixel PureCel® Plus-S Sensors for High-End Smartphones," PR Newswire, https://www.prnewswire.com/news-releases/omnivision-announces-new-family-of-20-megapixel-purecelplus-s-sensors-for-high-end-smartphones-300358733.html (dated Nov. 7, 2016; downloaded Nov. 20, 2023).
Onsemi AR0820 image, cross section of a CMOS image sensor product. The part in the image was shipped on Sep. 16, 2021. Applicant makes no representation that the part in the image is identical to the part identified in the separately submitted reference Bush, Nov. 8, 2018, ElectronicsWeekly.com ("BUSH article"); however, the imaged part and the part shown in the Bush article share the part No. "Onsemi AR0820."
Samsung S5K3H2YX03 image, cross section of a back side illuminated CMOS image sensor (CIS) product, taken from Samsung Galaxy S2 phone. The part in the image was shipped on Nov. 25, 2011. The cross section shows tungsten and aluminum lining a trench formed in the back side of the sensor connecting a wire bond with a contact in the image sensor. The second image is a top-down view showing the wire bond pad and the trench that are depicted in the cross section. Applicant makes no representation that the part in the images is identical to image sensor products in the Galaxy S2 product identified in the separately submitted Android Wiki reference https://android.fandom.com/wiki/Samsung_Galaxy_S2 ("Android Wiki article"); however, the imaged sensor was obtained from a product named "Galaxy S2."
Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image."
Sony Xperia LT26i Sensor image, cross-section of a front side illuminated CMOS image sensor obtained from a Sony Xperia LT26i phone. The part in the image was received on Mar. 29, 2012. The cross section shows a metal line connecting a solder bump at the back side to a contact at the front side of the sensor, with non-conductive epoxy covering the metal. The second image is a bottom-up view of the image sensor. The third image is a bottom-up closeup view showing the edge of the sensor, with the solder bumps and metal line of the cross-section visible. Applicant makes no representation that the part in the images is identical to image sensor products in the Sony Xperia LT26i product identified in the sepa-

(56) References Cited

OTHER PUBLICATIONS rately submitted Gadgets360 reference https://www.gadgets360.com/sony-xperia-s-609 ("Gadgets360 article"); however, the imaged sensor was obtained from a product named "Sony Xperia LT26i."

* cited by examiner

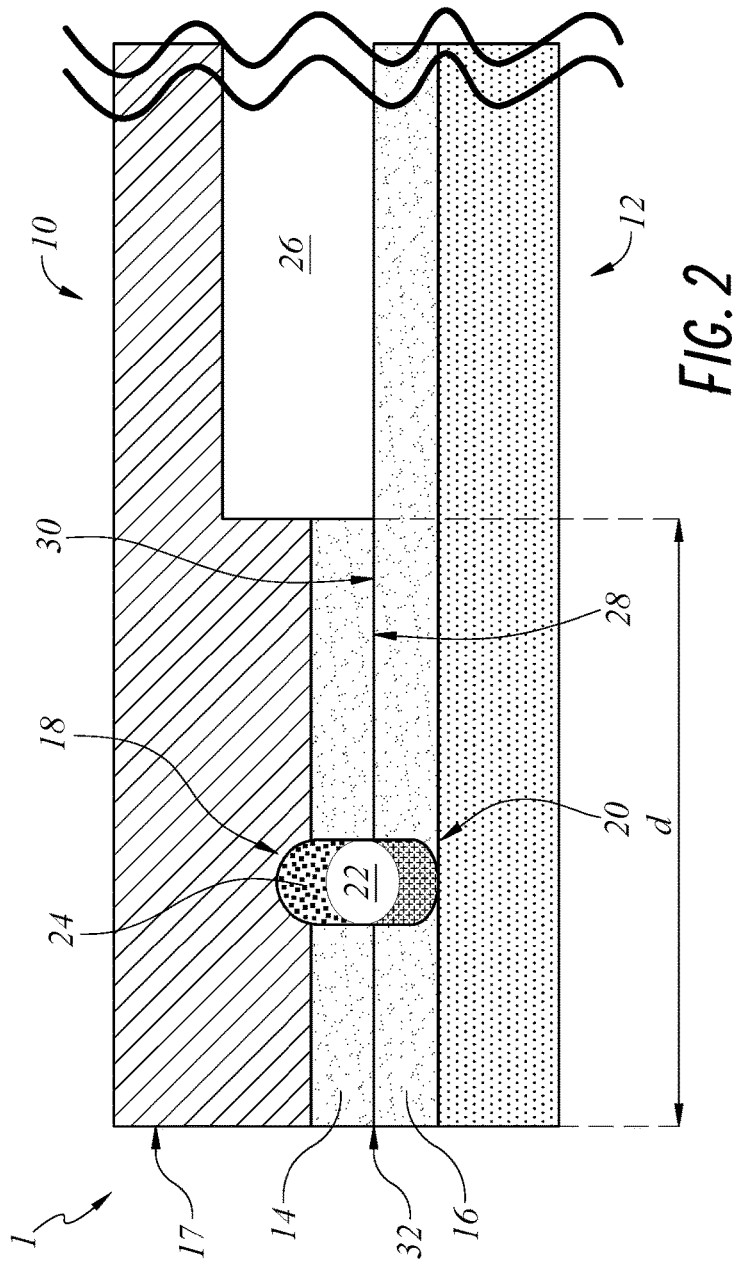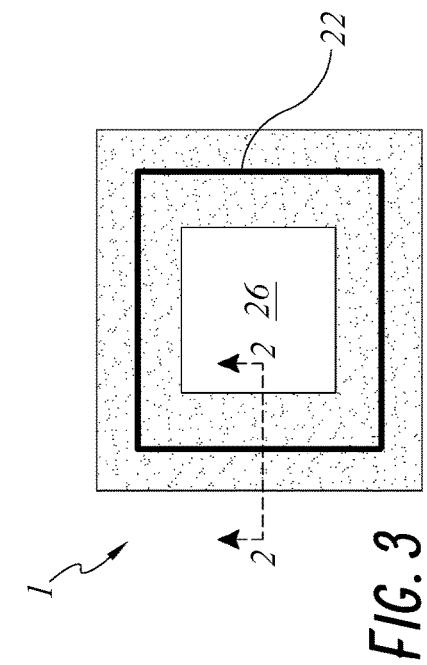

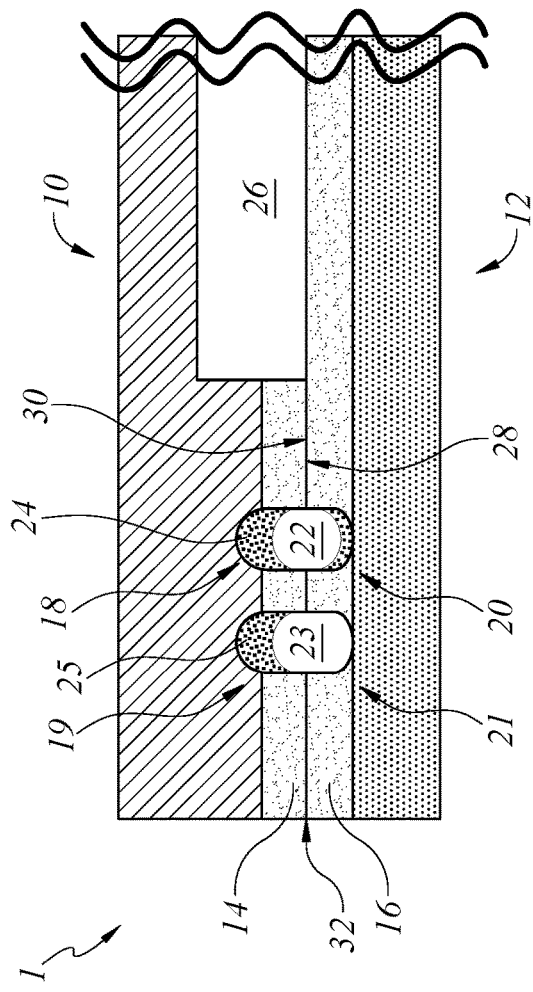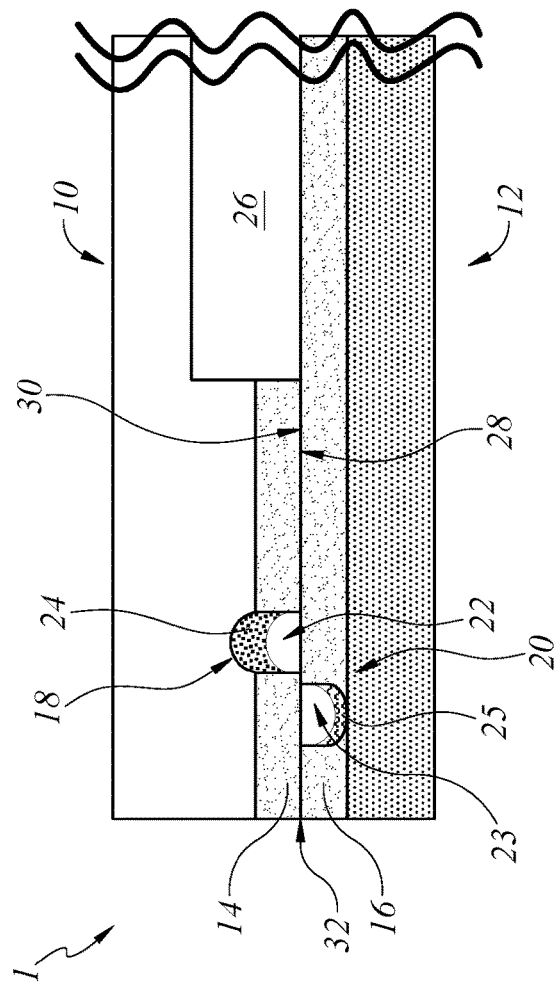

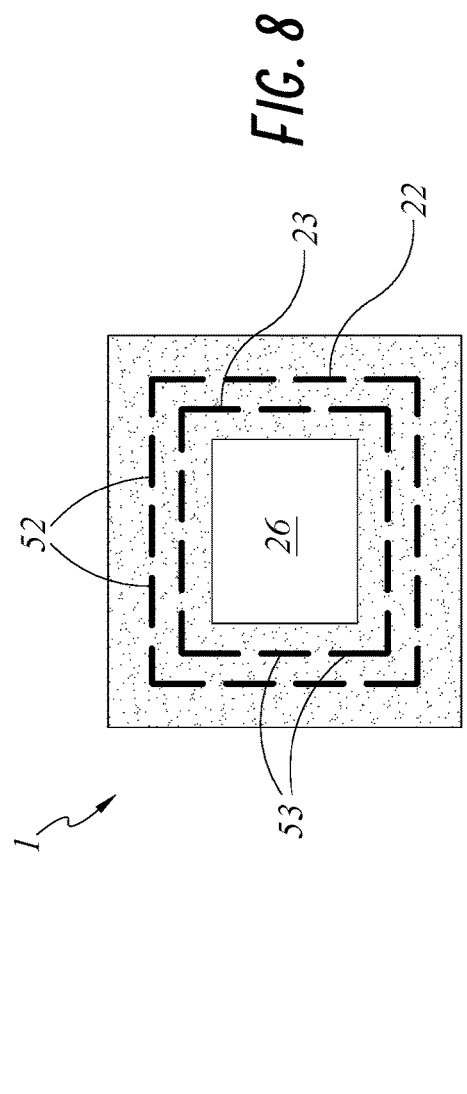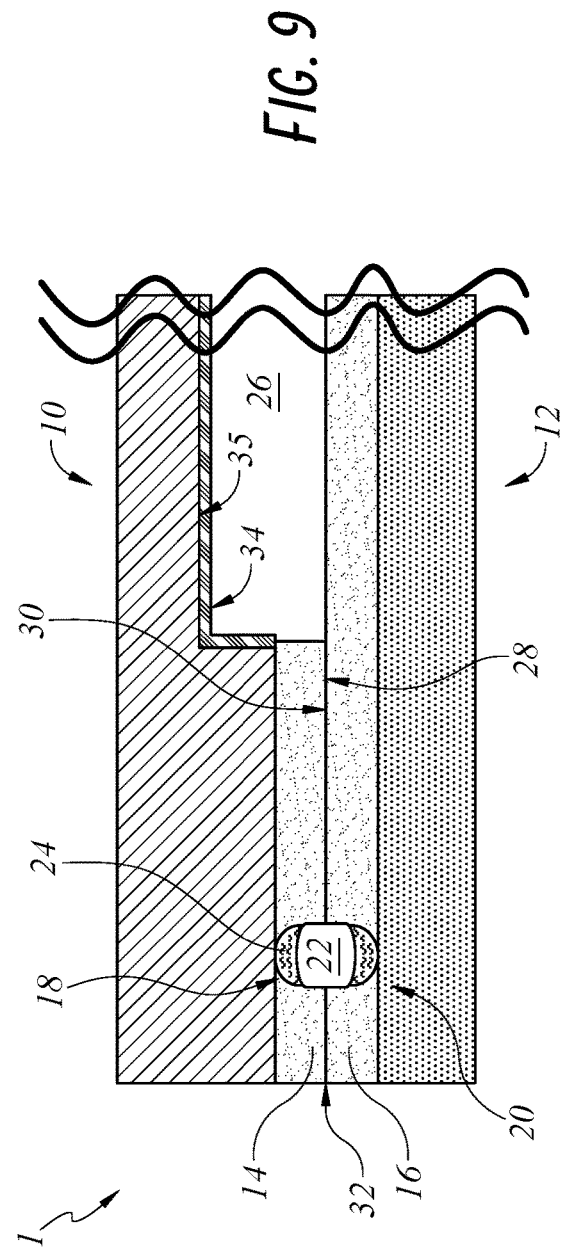

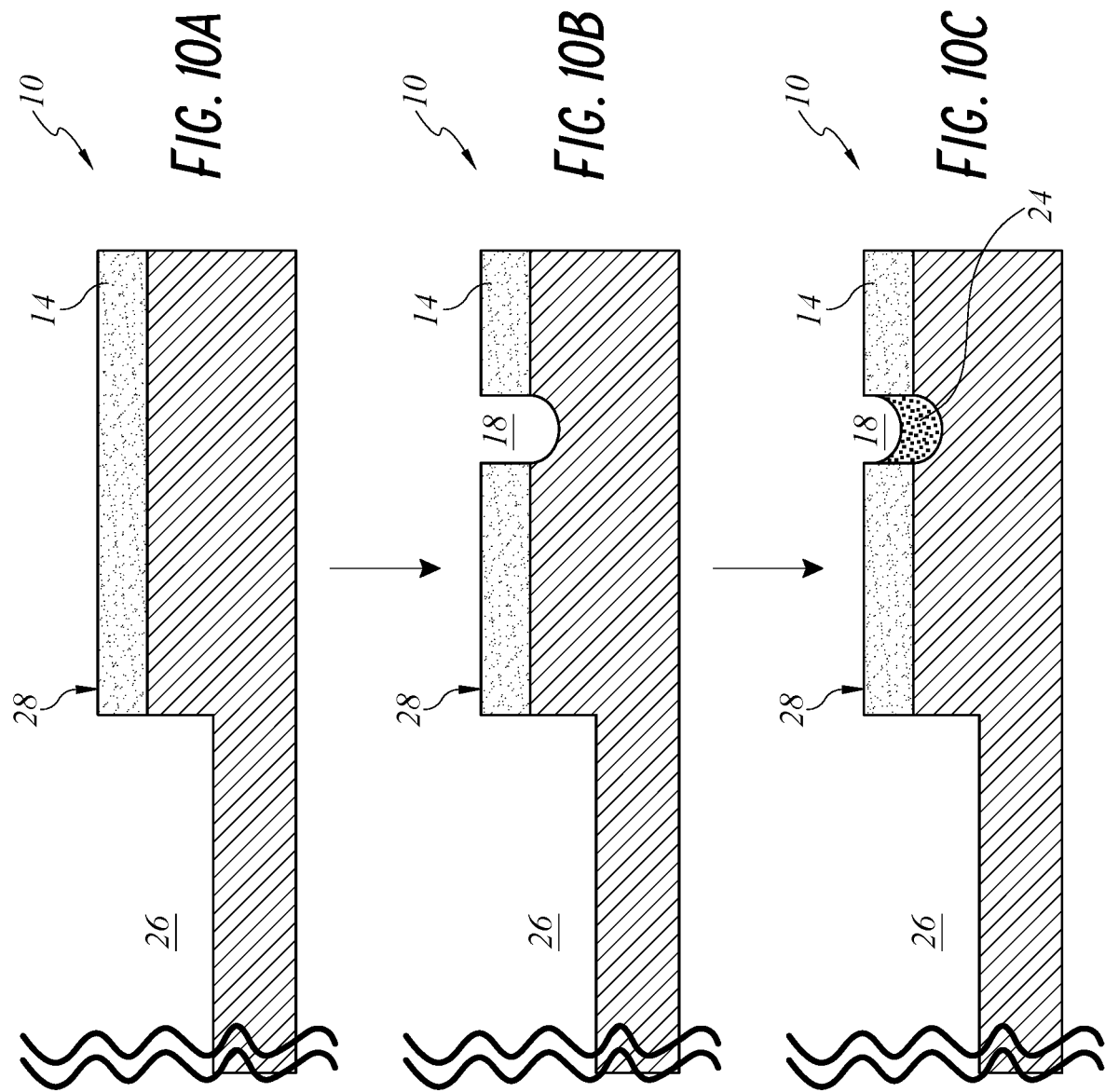

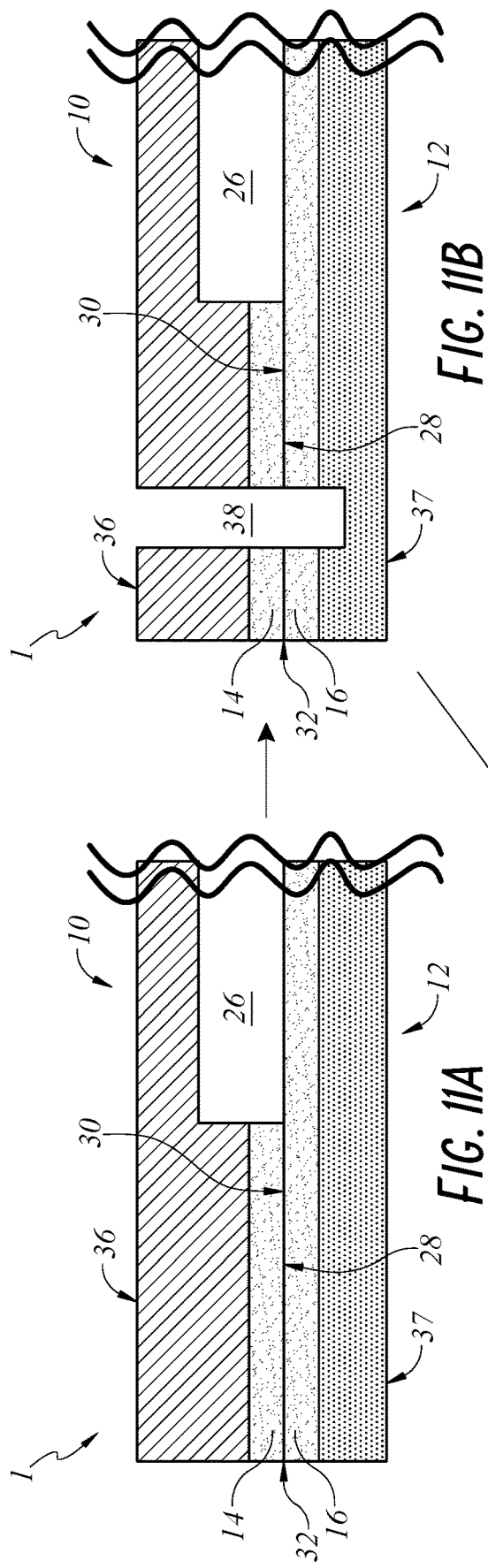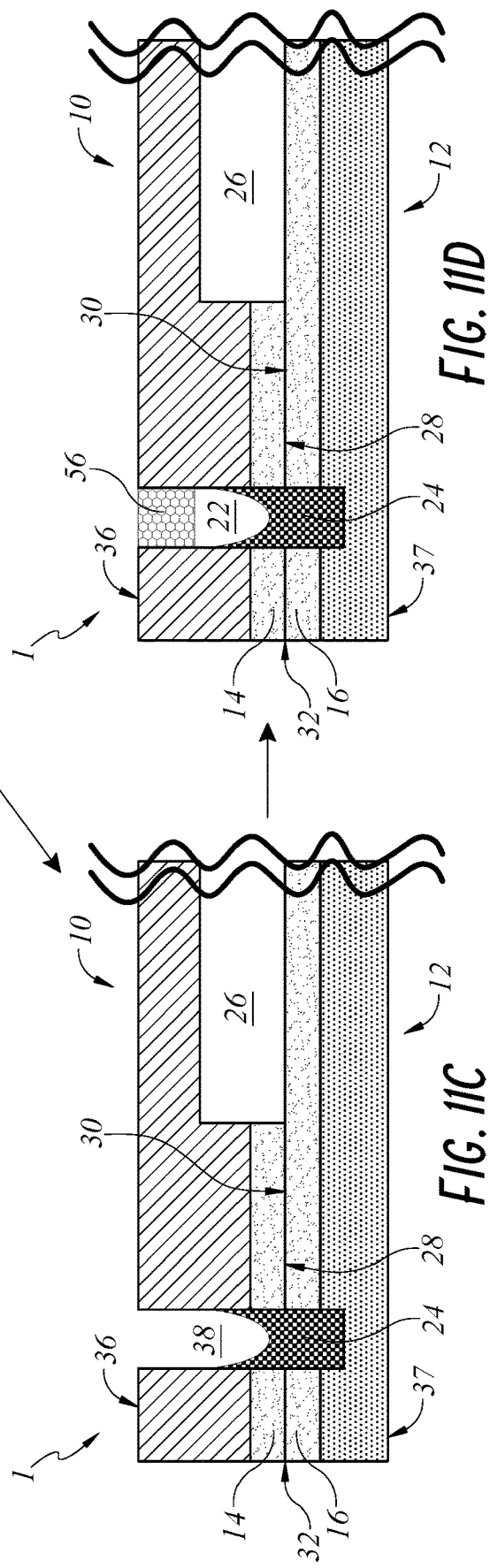

BONDED STRUCTURES

CROSS-REFERENCE TO RELATED APPLICATIONS

This application is a continuation of U.S. application Ser. No. 16/011,525, filed Jun. 18, 2018, entitled "BONDED STRUCTURES" which claims the benefit of U.S. Provisional Application No. 62/609,683 entitled "BONDED STRUCTURES," filed Dec. 22, 2017, the entire disclosure of which is incorporated herein by reference for all purposes.

BACKGROUND

Field

The field generally relates to bonded structures, and in particular, to bonded structures having a getter material for sealing an internal portion of the bonded structures.

Description of the Related Art

In semiconductor device fabrication and packaging, some integrated devices are sealed from the outside environs in order to, e.g., reduce contamination or prevent damage to the integrated device. For example, some microelectromechanical systems (MEMS) devices include a cavity defined by a cap attached to a substrate with an adhesive such as solder. However, some adhesives may be permeable to gases, such that the gases can, over time, pass through the adhesive and into the cavity. Moisture or some gases, such as hydrogen or oxygen gas, can damage sensitive integrated devices. Other adhesives, such as solder, may have other long-term reliability issues. Accordingly, there remains a continued need for improved seals for integrated devices.

BRIEF DESCRIPTION OF THE DRAWINGS

Specific implementations of the invention will now be described with reference to the following drawings, which are provided by way of example, and not limitation.

FIG. 2 is a schematic cross-sectional view of a portion of a bonded structure having a cavity.

FIG. 3 is a sectional plan view of the bonded structure of FIG. 2.

FIG. 4 is a schematic cross-sectional view of the bonded structure having a plurality of spaces for receiving getter material(s) disposed in the first and second elements.

FIG. 5 is a schematic cross-sectional view of a bonded structure having a first space comprising a first opening in the first element and a second space comprising a second opening in the second element, with the first and second spaces being laterally or horizontally spaced from one another.

FIG. 8 is a sectional plan view of the bonded structure having a plurality of channels disposed around an interior region of the bonded structure.

FIG. 9 is a schematic side cross-sectional view of a bonded structure with a getter layer disposed in the cavity.

FIG. 10A is a cross sectional view of the first element prior to forming an opening for receiving a getter material.

FIG. 10B is a cross sectional view of the first element of FIG. 10A after forming the opening and prior to receiving the getter material.

FIG. 10C is a cross sectional view of the first element of FIG. 10B after disposing the getter material in the opening.

FIG. 11A is a cross sectional view of a bonded structure, according to an embodiment.

FIG. 11B is a cross sectional view of the bonded structure of FIG. 11A after forming an opening in the bonded structure.

FIG. 11C is a cross sectional view of the bonded structure of FIG. 11B after disposing a getter material in the opening.

FIG. 11D is a cross sectional view of the bonded structure of FIG. 11C after plugging the opening.

DETAILED DESCRIPTION

Various embodiments disclosed herein relate to bonded structures that connect two elements (which may comprise semiconductor elements) in a manner that effectively seals interior portions and/or integrated devices of the semiconductor elements from the outside environs. For example, in some embodiments, a bonded structure can comprise a plurality of semiconductor elements bonded to one another along a bonding interface. An integrated device can be coupled to or formed with a semiconductor element. For example, in some embodiments, the bonded structure can comprise a microelectromechanical systems (MEMS) device in which a cap (a first semiconductor element) is bonded to a carrier (a second semiconductor element). A MEMS element (the integrated device) can be disposed in a cavity defined at least in part by the cap and the carrier. In other embodiments, the element(s) can comprise other types of elements, such as optical elements, etc.

In some arrangements, the bonded structure can comprise a getter material disposed between the first and second elements. In some embodiments, the getter material may absorb and/or occlude incident moisture or gases. In some embodiments, the getter material can prevent gases (or significantly reduce an amount of the gas(es)) from reaching interior regions and/or integrated devices of the bonded structure. In some embodiments, the getter material can be disposed in a space provided along the bonding surface. In some embodiments, the first and second elements can be directly bonded without an intervening adhesive, e.g., such that bonding interfaces of the first and second elements contact one another.

Figure 1:
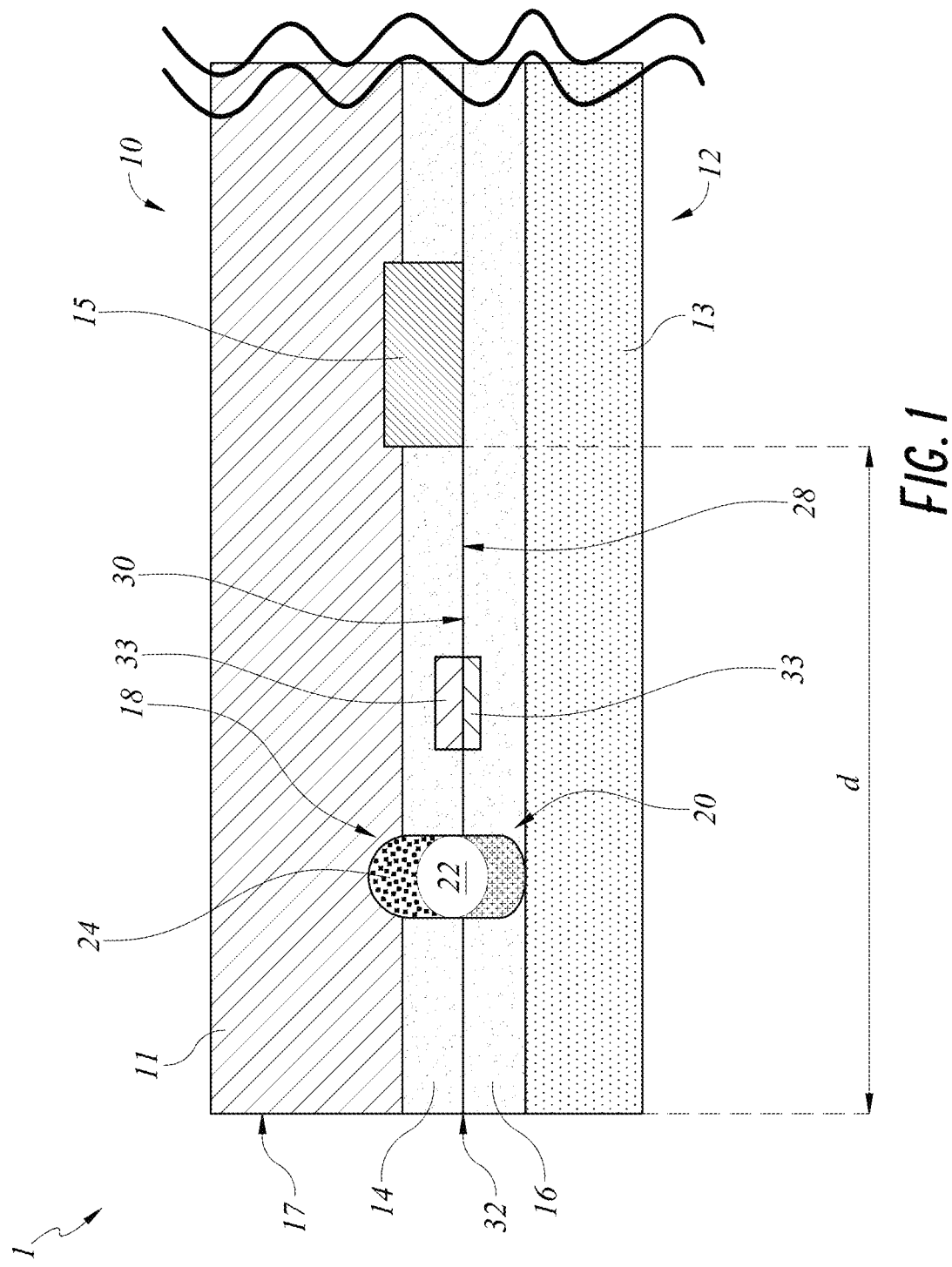
FIG. 1 is a schematic cross-sectional view of a portion of a bonded structure including a first element and a second element.

FIG. 1 is a schematic cross sectional view of a portion of a bonded structure 1 according to various embodiments. The bonded structure can include a first element 10, a second element 12, a getter material 24 disposed in a space or void 22 and an integrated device 15. The integrated device 15 can comprise any suitable type of device, such as an integrated circuit, a micro electro mechanical systems (MEMS) device, etc. In some embodiments, a first bonding surface 28 of the first element 10 and a second bonding surface 30 of the second element 12 can be bonded at a bonding interface 32 by way of direct bonding, e.g., without an intervening adhesive.

FIG. 2 is a schematic side cross sectional view of a portion of the bonded structure 1 according to another embodiment. Unlike the bonded structure 1 of FIG. 1, the bonded structure 1 of FIG. 2 includes a cavity 26 for receiving an integrated device. For example, the integrated device 15 shown in FIG. 1 can be disposed in the cavity 26 in FIG. 2. FIG. 3 is a sectional plan view of the bonded structure 1 of FIG. 2. It should be understood that the bonded structure 1 can include more than one integrated device 15 and/or more than one cavity 26, in some embodiments.

In some embodiments, the second element 12 can comprise a carrier to which the first element 10 is bonded. In some embodiments, the carrier can comprise an integrated device die, such as a processor die configured to process signals transduced by the integrated device 15. In some embodiments, the integrated device 15 can comprise a MEMS element, such as a MEMS switch, an accelerometer, a gyroscope, etc. The integrated device 15 can be coupled to or formed with the first semiconductor element 10 or the second semiconductor element 12. In some embodiments, the carrier can comprise a substrate, such as a semiconductor substrate (e.g., a silicon interposer with conductive interconnects), a printed circuit board (PCB), a ceramic substrate, a glass substrate, or any other suitable carrier. In such embodiments, the carrier can transfer signals between the integrated device 15 and a larger packaging structure or electronic system (not shown). In some embodiments, the carrier can comprise an integrated device die, such as a processor die configured to process signals transduced by the integrated device 15. In some embodiments, the integrated device 15 can comprise a MEMS element, such as a MEMS switch, an accelerometer, a gyroscope, etc. The integrated device 15 can be coupled to or formed with the first semiconductor element 10 or the second semiconductor element 12.

In some configurations, it can be important to isolate or separate the integrated device die 15 from the outside environs, e.g., from exposure to gases and/or contaminants. For example, for some integrated devices, exposure to moisture or gases (such as hydrogen or oxygen gas) can damage the integrated device 15 or other components. In other examples, leakage of any other gases from the outside environment (e.g., oxygen, nitrogen, etc.) may not be desired, as it may change the pressure inside the cavity, effectively altering the device performance. Accordingly, it can be important to provide a seal that effectively or substantially seals (e.g., hermetically or near-hermetically seals) the integrated device 15 (FIG. 1) and/or the cavity 26 (FIG. 2) from gases.

In some embodiments, the space 22 can comprise a first opening 18 in the first element 10 and a second opening 20 in the second element 12, such as in the embodiments of FIGS. 1 to 3. Even though the first and second openings 18, 20 shown in FIG. 1 may be generally aligned to define the space 22, in practice, there can be offsets between positions of the first and second openings 18, 20. In some embodiments, the space 22 can be enclosed. However, as shown in some other embodiments, the space 22 may only comprise one opening in either the first or the second elements 10, 12 (see FIGS. 6 and 7). The openings 18, 20 can comprise trenches formed at the bonding surface(s) 28, 30 of the first and/or second elements 10, 12. The space or void 22 with the getter material 24 can extend around the device in an effectively closed profile. In some embodiments, the space or void 22 can comprise a continuous channel around the integrated device 15 and/or the cavity 26, as shown in FIG. 3. However, in other embodiments, the space 22 may not comprise a continuous channel. Rather, the space 22 can comprise a plurality of space portions and/or a plurality of channel portions around the integrated device 15 and/or the cavity 26, which collectively define an effectively closed profile around the device 15 and/or cavity 26. Thus, the space 22 with getter material 24 can define an effectively closed profile around the device 15 and/or cavity 26 to seal the device 15 and/or cavity 26 from the outside environs, regardless of whether the space 20 is continuous or includes gaps.

The disclosed embodiments can utilize getter materials that can collect free gases incident to them by, for example, absorption and/or occlusion. Different getter materials can have different properties. For example, aluminum (Al) can have a getter capacity of about 1 Pa-l/mg against oxygen ($O_2$). Barium (Ba) can have a getter capacity of about 0.69 Pa-l/mg against carbon dioxide ($CO_2$), about 11.5 Pa-l/mg against hydrogen ($H_2$), and about 2 Pa-l/mg against ($O_2$). Titanium (Ti) can have about 4.4 Pa-l/mg against ($O_2$). Thus, in some embodiments, the getter material 24 can be selected based on the types of gases that are likely be present in the environment of which the bonded structure 1 would be used. Accordingly, the getter material 24 in the space 22 disposed along the bonding surface 32 can effectively provide seals for preserving hermetical or near-hermetical property for the integrated device 15 and/or the cavity 26. In some embodiments, for example, the getter material 24 can comprise one of or any two or more combination of Al, Ba, Ti, magnesium (Mg), niobium (Cb), zirconium (Zr), thorium (Th), phosphorus (P), vanadium (V), iron (Fe), and/or any other getter materials suitable. The getter material 24 can fill the space 22 completely or partially. In some embodiments, the getter material 24 can be coated around an inner periphery of the space 22. In some embodiments, the getter material 24 can comprise a powder form, solid form, liquid form, or any other suitable form for targeted purposes. In some embodiments, the openings 18, 20 can receive two distinct types of getter material. Such embodiments can beneficially act on different gases at the bonding surface 32. In some embodiments, the same getter material 24 can be provided in each element 10, 12. In other embodiments, each element 10, 12 may utilize different getter materials.

The first and second elements can be bonded in any suitable manner, including by direct bonding. In some embodiments, the direct bond between the first element 10 and the second element 12 can include a direct bond between the first bonding surface 28 of the first element 10 and the second bonding surface 30 of the second element 12. Preparation for bonding top surfaces of respective substrates 11, 13 can include provision of nonconductive layers 14, 16, such as silicon oxide, with exposed openings 18, 20. The bonding surfaces of the first element 10 and the second element 12 can be polished to a very high degree of smoothness (e.g., less than 20 nm surface roughness, or more particularly, less than 5 nm surface roughness) for example, by chemical mechanical polishing (CMP). In some embodiments, the surfaces to be bonded may be terminated with a suitable species and activated prior to bonding. For example, in some embodiments, the bonding surfaces 28, 30 of the bonding layer to be bonded, such as silicon oxide material, may be very slightly etched for activation and exposed to a nitrogen-containing solution and terminated with a nitrogen-containing species. As one example, the surfaces 28, 30 to be bonded may be exposed to an ammonia dip after a very slight etch, and/or a nitrogen-containing plasma (with or without a separate etch). Once the respective surfaces are prepared, the bonding surfaces 28, 30 (such as silicon oxide) of the first and second elements 10, 12 can be brought into contact. The interaction of the activated surfaces can cause the first bonding surface 28 of the first element 10 to directly bond with the second surface 30 of the second element 12 without an intervening adhesive, without application of external pressure, without application of voltage, and at room temperature. In various embodiments, the bonding forces of the nonconductive regions can include covalent bonds that are greater than Van der Waals bonds and exert significant forces between the conductive features 33. Prior to any heat treatment, the bonding energy of the dielectric-dielectric surface can be in a range from 150-300 mJ/m$^2$, which can increase to 1500-4000 mJ/m$^2$ after a period of heat treatment. Additional details of the direct bonding processes used in conjunction with each of the disclosed embodiments may be found throughout U.S. Pat. Nos. 7,126,212; 8,153,505; 7,622,324; 7,602,070; 8,163,373; 8,389,378; and 8,735,219, and throughout U.S. Patent Application Publication Nos. 2017/0062366; 2016/0314346; 2017/0200711, the contents of each of which are hereby incorporated by reference herein in their entirety and for all purposes. In still other embodiments, the elements 10, 12 can be bonded with an adhesive.

In some embodiments, the bonding surface 32 can have a dimension d from an outer edge 17 to the integrated device 15 or the cavity 26, for example, in a range of 10 µm to 600 µm, in a range of 10 µm to 80 µm, in a range of 40 µm to 60 µm, in a range of 100 µm to 600 µm, in a range of 200 µm to 300 µm, etc.

FIGS. 4-9 show alternative embodiments of the bonded structure 1. FIG. 4 is a schematic cross sectional view of the bonded structure 1 having the space 22 and a second space 23 disposed horizontally adjacent to each other for receiving the getter material 24 and a second getter material 25, respectively. Unless otherwise noted, the components of FIG. 4 may be the same as or generally similar to like-numbered components of FIGS. 1-3. The space 22 can comprise the first and second openings 18, 20 formed in the respective first and second elements 10, 12, and the second space 23 can comprise third and fourth openings 19, 21 formed in the respective first and second elements 10, 12. In some embodiments, the space 22 and the second space 23 can comprise the same or different shapes and/or sizes. In other embodiments, the openings 18, 20, 19 and 21 can comprise the same or different shapes and/or sizes. In some embodiments, the getter material 24 and the second getter material 25 can comprise the same or different getter materials. It can be beneficial to have different getter materials 24, 25, in some embodiments. For example, different getter materials can act on different types gases to more effectively seal the integrated device and/or the cavity 26 within the bonded structure 1.

FIG. 5 is a schematic cross sectional view of the bonded structure 1 having the space 22 comprising the first opening 18 in the first element 10 and the second space 23 comprising the second opening 20 in the second element 12 disposed horizontally adjacent to each other for receiving the getter material 24 and the second getter material 25 respectively. Unless otherwise noted, the components of FIG. 5 may be the same as or generally similar to like-numbered components of FIGS. 1-4. Unlike the bonded structure 1 of FIGS. 1-4, the first opening 18 can be formed in the first element 10 and the second opening 20 can be formed in the second element 12. In some embodiments, the first opening 18 and the second opening 20 can comprise the same or different shapes and/or sizes. Further, as shown, the first and second openings 18, 20 can be horizontally mismatched, for example, such that they do not together cooperate to define a common space to receive the getter material. Therefore, the first opening 18 and a portion of the second bonding surface 30 can define the space 22, and the second opening 20 and a portion of the first bonding surface 28 can define the second space 23. Such embodiments that physically separate the spaces 22, 23 can be beneficial because, different getter materials 24, 25 may react with one another, which can affect the performance of the getter materials 24, 25 when the spaces 22, 23 are not separated from one another. Moreover, getter filling processes may limit the type of these reactive getter materials that are to be received within the elements (e.g., within the die or wafer (top or bottom)) e.g. screen printing methods. For example, some filling processes may be suitable for use with some devices or material sets (e.g., with one type of die, carrier, or substrate), and may be unsuitable for other types of devices. By separating the spaces 22, 23 in FIG. 5, different processes and materials may be used to fill the spaces in the first and second elements 10, 12, respectively.

Figure 6:
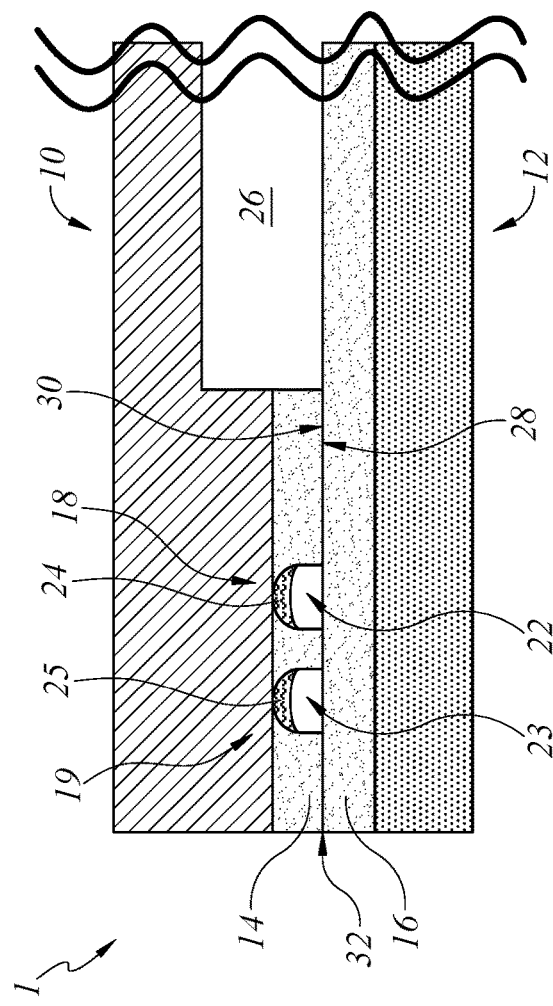
FIG. 6 is a schematic cross-sectional view of a bonded structure in which a first space comprising a first opening in the second element and a second space comprising a second opening in the second element, with the first and second spaces being horizontally spaced.

FIG. 6 is a schematic cross sectional view of the bonded structure 1 in which the space 22 comprises the opening 18 formed in the first element 10 and the second space 23 comprises the opening 19 formed in the first element 10. As shown, the first and second spaces 22, 23 can be disposed horizontally adjacent to each other for receiving the getter material 24 and the second getter material 25 respectively. Unless otherwise noted, the components of FIG. 6 may be the same as or generally similar to like-numbered components of FIGS. 1-5. In FIG. 6, the opening 18 formed in the first element 10 and a first portion of the second bonding surface 30 can comprise the first space 22, and the opening 19 formed in the first element 10 and a second portion of the second bonding surface 30 can comprise the second space 23. This embodiment can be beneficial because the openings may be formed only on the first element such that formation of the openings can be simpler (e.g., fewer steps in a forming process, etc.) than forming openings in both the first and second elements 10, 12. In some embodiments, having the openings 18, 19 only in the first element 10 can be beneficial since the first element can serve as a dummy element acting as a cap to form a cavity 26. The second element 12 can comprise a functional chip or device die; in such embodiments, providing the openings in only the first element 10 may obviate the use of openings in the second element 12, e.g., an active chip or device die, which can beneficially avoid complications related to the wiring in second element 12. However, it should be understood that, in some embodiments, openings can be formed in the second element 12 as well.

Figure 7:
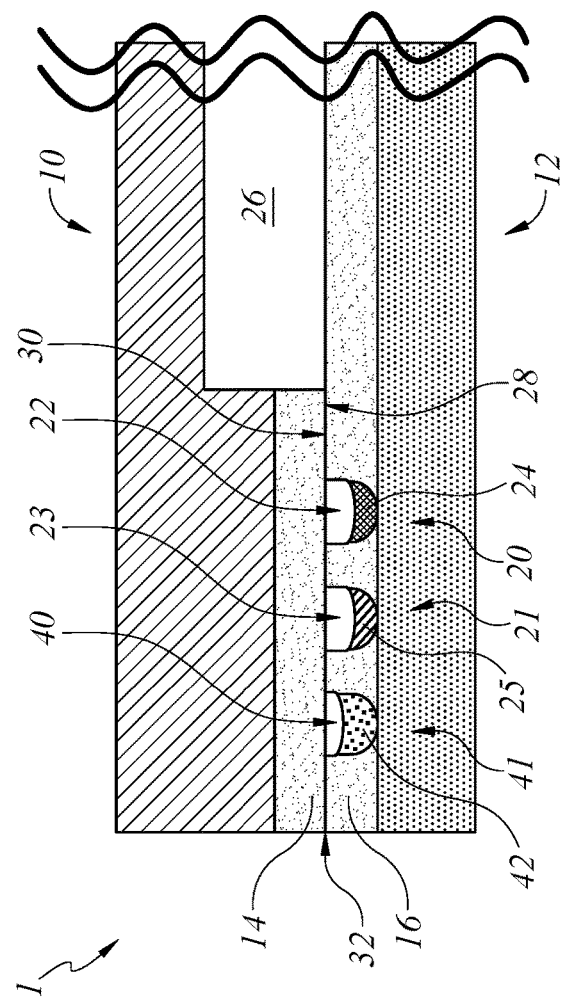
FIG. 7 is a schematic cross-sectional view of a bonded structure in which an element has a plurality of spaces that are horizontally spaced from one another.

FIG. 7 is a schematic cross sectional view of the bonded structure 1 in which the space 22 comprises the opening 20 formed in the second element 12, the second space 23 comprises the opening 21 formed in the second element 12, and the third space 40 comprises an opening 41 formed in the second element 12. In should be understood that the openings can be formed in the first element 10, in some embodiments. As shown, the first, second and third spaces, 22, 23, 41 can be disposed horizontally adjacent to each other for receiving the getter material 24, the second getter material 25 and a third getter material 42 respectively. Unless otherwise noted, the components of FIG. 7 may be the same as or generally similar to like-numbered components of FIGS. 1-6. The embodiment shown in FIGS. 6 and 7 are similar except in the embodiment in FIG. 7 the third space 40 can be provided for receiving the third getter material 42. The opening 23 formed in the second element 12 and a third portion of the first bonding surface 28 can form the third space 40. In some embodiments, increasing the number of spaces for receiving different getter materials can be beneficial because, as explained above, different getter materials can act on different types of gases making the seal of the bonded structure 1 more hermetical.

FIG. 8 is a sectional plan view of the bonded structure 1 having the spaces 22, 23 separated by gaps. Unless otherwise noted, the components of FIG. 8 may be the same as or generally similar to like-numbered components of FIGS. 1-7. As illustrated in FIG. 8, the spaces 22, 23 are disposed to form channels comprising channel portions 52, 53. As shown, the channel portions 52 can be provided around the channel portions 53. Although there are gaps between adjacent channel portions 52, 53, the illustrated embodiment can nevertheless provide an effectively closed profile for the cavity 26. It should be understood that the channel portions 52, 53 can have different shapes and/or sizes. In some embodiments, one of the spaces 22, 23 can comprise a continuous channel and the other can comprise a discontinuous channel. In some embodiments, different channel portions 52, 53 of the spaces 22, 23 can comprise different getter materials suitable for an environment that the bonded structure 1 is to be used in. It should also be appreciated that any of the embodiments disclosed herein can utilize discontinuous channels to define the effectively closed profile. In some embodiments, the bonded structure 1 can have one or more electrical connections (e.g., wiring) between the channel portions 52, 53. In such embodiments, the integrated device and/or the cavity 26 can be accessed from outside of the bonded structure 1 through the connections. In the illustrated embodiment, the channel portions 52 can at least partially cover or overlap the gaps between the channel portions 53 that are disposed within the channel portions 52. For example, the channel portions 52 may be positioned so as to block gases from passing through the gaps between the channel portions 53. Similarly, the channel portions 53 may be positioned so as to block gases that pass through the gaps between the channel portions 52 from entering the cavity 26.

FIG. 9 is a schematic cross sectional view of the bonded structure 1 with a getter layer 34 disposed in the cavity 26. Unless otherwise noted, the components of FIG. 9 may be the same as or generally similar to like-numbered components of FIGS. 1-8. The embodiment illustrated in FIG. 9 is similar to the embodiment illustrated in FIG. 2 except the bonded structure 1 of FIG. 9 further includes the getter layer 34 in the cavity 26. As shown, the getter layer 34 can be provided along an inner wall 35 of the cavity 26. In some embodiments, the getter layer 34 can be activated when residual gas enters into the cavity 26 to absorb and/or occlude the residual gas to maintain ideal environment within the cavity 26. In some embodiments, the getter layer 34 can be used to selectively alter the pressure within the cavity 26. In some embodiments, the bonded structure can include more than one cavity 26 and each cavity may include different getter layer to alter the pressures in different cavities in the bonded structure 1. As with the getter materials disposed between at the bonding surface, the getter layer 34 can comprise one of or any two or more combination of Al, Ba, Ti, Mg, Cb, Zr, Th, P, V, Fe, and/or any other getter materials suitable.

FIGS. 10A-10C show steps for forming the first opening 18 in the first element 10 from the first bonding surface 28 and disposing the getter material 24 in the opening 18. In FIG. 10A, the first element can be provided. As shown in FIG. 10A, the cavity 26 may be formed in the element 10. The cavity 26 can be formed in any suitable way, e.g., by etching, drilling, etc. As shown in FIG. 10B the opening 18 can be formed by way of, for example, etching (wet or dry), drilling (e.g., mechanical drilling, laser drilling, etc.), and/or any other suitable processes. In the embodiment of FIG. 10A, the opening 18 can be formed after forming the cavity 26. In other embodiments, however, the cavity 26 can be formed before the opening 18, or the cavity 26 and opening 18 can be formed at the same time. Referring to FIG. 10C, after the opening 18 is formed, the getter material 24 can be disposed in the opening 18 by way of, for example, electrochemical deposition, sputter coating, chemical vapor deposition (CVD), physical vapor deposition (PVD), screen printing, etc., and the process can vary depending on the particular material used as the getter material 24. The getter material 24 can be disposed in the opening completely or partially. It should be understood that a similar process can be applied to the second element 12 (see for example FIG. 2) to form openings in the second element 12. In some embodiments, after the getter material 24 is disposed in the opening 18, a second element can be provided on the first bonding surface 28 to define the space 22 (see for example FIG. 2).

FIGS. 11A-11D show steps for forming an trench 38 from a back surface 36 of the first element 10, disposing the getter material 24 in the trench 38, and forming the space or void 22. In FIG. 11A, a bonded structure 1 can be provided. As shown in FIG. 11B, the trench 38 can be formed by way of, for example, etching (wet, dry), drilling (e.g., mechanical drilling, laser drilling, etc.), and/or any other suitable processes. Referring to FIG. 11C, after the trench 38 is formed, the getter material 24 can be disposed in the trench 38 by way of, for example, electrochemical deposition, sputter coating, chemical vapor deposition (CVD), physical vapor deposition (PVD), screen printing, but the process can vary depending on the particular material used as the getter material 24. Turning to FIG. 11D, a plug 56 can be provided to plug the trench 38 to define the space 22. The getter material 24 can fully or partially fill the space 22. The plug can comprise, for example, a polymer material (e.g., epoxy, resin, epoxy mold compound, etc.). It should be understood that a similar process can be applied from a back surface 37 of the second element 12.

In some embodiments, the bonded structure of FIG. 11A may already include the space 22 along the bonding interface 32 after bonding the first and second elements 10, 12. The space 22 may not have the getter material therein. In such embodiments, the trench 38 from the back surface 36 of the first element 10 can be provided only for disposing the getter material 24 into the space 22 already formed and not to form the openings for the space 22. This may allow the trench 38 for providing the getter material 24 to have more flexible dimensional configurations than what is illustrated in FIGS. 11B-11D because the opening 38 may not depend on the dimensions of the space 22 in which the getter material 24 is disposed. For example, the trench 38 may be narrower than the space 22. This can be beneficial, for example, when a thickness of the first element 10 from the front surface to the back surface is relatively thick (e.g., larger than 50 um), because forming the trench 38 in such thick element may create a relatively big trench. If the space 22 were already formed, opening 38 from a back surface 36 may be narrower than a diameter of the space 22, which reduces a dimension of the plug 56.

Figure 12:
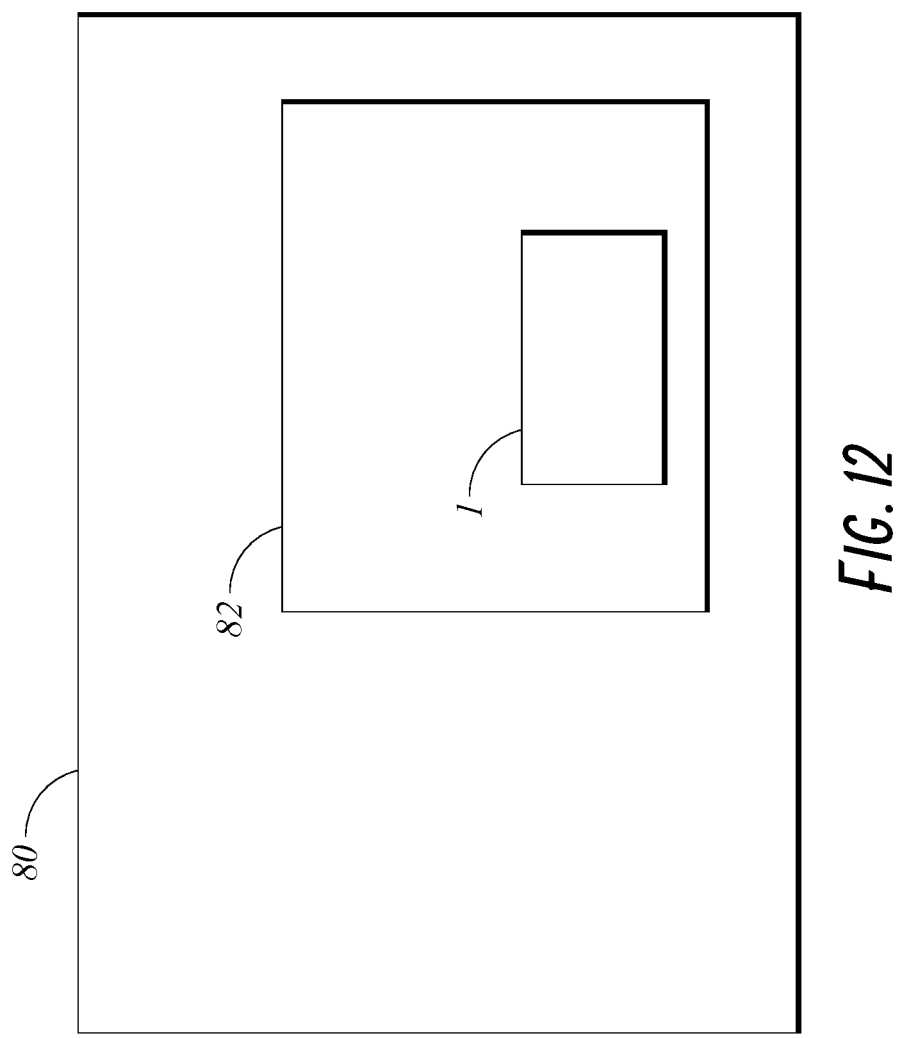
FIG. 12 is a schematic diagram of an electronic system incorporating one or more bonded structures.

FIG. 12 is a schematic diagram of an electronic system 80 incorporating one or more bonded structures 1, according to various embodiments. The system 80 can comprise any suitable type of electronic device, such as a mobile electronic device (e.g., a smartphone, a tablet computing device, a laptop computer, etc.), a desktop computer, an automobile or components thereof, a stereo system, a medical device, a camera, or any other suitable type of system. In some embodiments, the electronic system 80 can comprise a microprocessor, a graphics processor, an electronic recording device, or digital memory. The system 80 can include one or more device packages 82 which are mechanically and electrically connected to the system 80, e.g., by way of one or more motherboards. Each package 82 can comprise one or more bonded structures 1. The system 80 shown in FIG. 8 can comprise any of the bonded structures 1 and associated seals shown and described herein.

In one aspect, a bonded structure is disclosed. The bonded structure can include a first element having a first bonding surface, a second element having a second bonding surface. The first and second bonding surfaces can be bonded to one another along a bonding interface. The bonded structure can further include an integrated device that is coupled to or formed with the first element or the second element. The bonded structure can also include a channel that is disposed along the bonding interface around the integrated device.

In some embodiments, the bonded structure can also include a getter material disposed in the channel. The getter material can be configured to reduce the diffusion of gas into an interior region of the bonded structure. The first and second bonding surfaces can be directly bonded without an intervening adhesive. In some embodiments, the bonding surface can have a dimension from an outer edge to the integrated device in a range of 10 μm to 600 μm. The channel can include a first trench disposed through the first bonding surface and a second trench disposed through the second bonding surface.

In some embodiments, the bonded structure can include a cavity and the integrated device can be disposed in the cavity. The channel and the getter material can be disposed around the cavity.

In some embodiments, the channel can comprise a continuous channel surrounding the integrated device. A first group of the channel portions can be filled with the getter material and a second group of the channel portions can be filled with a second getter material.

In some embodiments, the getter material can comprise at least one of titanium (Ti), tantalum (Ta), aluminum (Al), magnesium (Mg), thorium (Th), niobium (Cb), zirconium (Zr), and phosphorus (P).

In some embodiments, the channel can be formed in only one of the first and second elements.

In some embodiments, the channel can comprise a first trench disposed through the first bonding surface and a second trench disposed through the second bonding surface. The channel can comprise a plurality of trenches that are offset laterally along the bonding interface.

In another aspect, a bonded structure is disclosed. The bonded structure can include a first element, a second element that is directly bonded to the first element along a bonding interface without an intervening adhesive, and a getter material that is disposed in a space along the bonding surface. The getter material is configured to reduce the diffusion of gas into an interior region of the bonded structure.

In some embodiments, the space can comprise a channel. In some embodiments, the space is enclosed. The bonded structure can also include an integrated device that is coupled to or formed with the first element or the second element. The channel can be disposed around the integrated device to define an effectively closed profile.

In another aspect a method of forming a bonded structure is disclosed. The method can include providing a first element that has a first bonding surface. An opening is disposed through a portion of the first bonding surface. The method also includes disposing a getter material in the opening. The method further includes bonding a second bonding surface of a second element to the first bonding surface of the first element. The first and second bonding surfaces are bonded such that the opening and a portion of the second element cooperate to define a space configured to receive the getter material.

In some embodiments, the opening can comprise a trench and the space can comprise a channel. In some embodiments, the opening can be provided by etching the first element from the first bonding surface to form a plurality of opening portions around the integrated device.

In some embodiments, the method can also include forming the opening and forming a second opening in the first element. The second opening are laterally offset from the opening. After the bonding, the second opening and a second portion of the second element can cooperate to define a second space configured to receive a second getter material.

In some embodiments, the method can also include forming the opening in the first element and forming a second opening in the second element through a portion of the second bonding surface. The opening and the second opening can cooperate to define the space.

In some embodiments, the method can also include forming the opening by removing a portion of the first element from a back surface of the first element opposite the first bonding surface. The method can also include filling at least a portion of the opening from the back surface after disposing the getter material to form the for the getter material.

In some embodiments, the method can also include defining a cavity between the first element and the second element. The integrated device can be disposed in the cavity.

For purposes of summarizing the disclosed embodiments and the advantages achieved over the prior art, certain objects and advantages have been described herein. Of course, it is to be understood that not necessarily all such objects or advantages may be achieved in accordance with any particular embodiment. Thus, for example, those skilled in the art will recognize that the disclosed implementations may be embodied or carried out in a manner that achieves or optimizes one advantage or group of advantages as taught or suggested herein without necessarily achieving other objects or advantages as may be taught or suggested herein.

All of these embodiments are intended to be within the scope of this disclosure. These and other embodiments will become readily apparent to those skilled in the art from the following detailed description of the embodiments having reference to the attached figures, the claims not being limited to any particular embodiment(s) disclosed. Although this certain embodiments and examples have been disclosed herein, it will be understood by those skilled in the art that the disclosed implementations extend beyond the specifically disclosed embodiments to other alternative embodiments and/or uses and obvious modifications and equivalents thereof. In addition, while several variations have been shown and described in detail, other modifications will be readily apparent to those of skill in the art based upon this disclosure. It is also contemplated that various combinations or sub-combinations of the specific features and aspects of the embodiments may be made and still fall within the scope. It should be understood that various features and aspects of the disclosed embodiments can be combined with, or substituted for, one another in order to form varying modes of the disclosed implementations. Thus, it is intended that the scope of the subject matter herein disclosed should not be limited by the particular disclosed embodiments described above, but should be determined only by a fair reading of the claims that follow.

What is claimed is:

1. A method of forming a bonded structure, the method comprising:
   providing a first element having a first bonding surface and an opening disposed through a portion of the first bonding surface and extending around an integrated device coupled to or formed with the first element;
   disposing a getter material in the opening; and
   bonding a second bonding surface of a second element to the first bonding surface of the first element such that the opening and a portion of the second element cooperate to define a space to receive the getter material,
   wherein the second bonding surface of the second element is directly bonded to the first bonding surface of the first element, and
   wherein the first bonding surface comprises a first nonconductive layer and a first conductive feature, and the second bonding surface comprises a second nonconductive layer and a second conductive feature.

2. The method of claim 1, wherein the opening comprises a trench and the space comprises a channel.

3. The method of claim 2, wherein the channel comprises a plurality of channel portions around an integrated device coupled to or formed with the first element or the second element, the channel defining an effectively closed profile around the integrated device.

4. The method of claim 1, further comprising forming the opening and forming a second opening in the first element, the second opening laterally offset from the opening.

5. The method of claim 4, wherein, after the bonding, the second opening and a second portion of the second element cooperate to define a second space to receive a second getter material.

6. The method of claim 5, wherein the first getter material and the second getter material comprise different materials.

7. The method of claim 1, wherein the opening is provided by etching the first element from the first bonding surface to form a plurality of opening portions around the integrated device.

8. The method of claim 1, further comprising defining a cavity between the first element and the second element, wherein the integrated device is disposed in the cavity.

9. The method of claim 8, wherein the opening with the getter material extend around the integrated device in an effectively closed profile.

10. A method of forming a bonded structure, the method comprising:
    providing a first element having a first bonding surface and an opening disposed through a portion of the first bonding surface, providing the first element comprising forming the opening in the first element and forming a second opening in the second element through a portion of a second bonding surface;
    disposing a getter material in the opening; and
    bonding the second bonding surface of a second element to the first bonding surface of the first element such that the opening and a portion of the second element cooperate to define a space to receive the getter material.

11. The method of claim 10, wherein the opening and the second opening cooperate to define the space.

12. A method of forming a bonded structure, the method comprising:
    providing a first element having a first bonding surface and an opening disposed through a portion of the first bonding surface and extending around an integrated device coupled to or formed with the first element, providing the first element comprising forming the opening by removing a portion of the first element from a back surface of the first element opposite the first bonding surface;
    disposing a getter material in the opening; and
    bonding a second bonding surface of a second element to the first bonding surface of the first element such that the opening and a portion of the second element cooperate to define a space to receive the getter material.

13. The method of claim 12, further comprising filling at least a portion of the opening from the back surface after disposing the getter material.

14. The method of claim 12, wherein the second bonding surface of the second element is directly bonded to the first bonding surface of the first element.

15. The method of claim 14, wherein the first bonding surface comprises a first nonconductive layer and a first conductive feature, and the second bonding surface comprises a second nonconductive layer and a second conductive feature.

16. A method of forming a bonded structure, the method comprising:
    directly bonding a front side of a first element to a front side of a second element, wherein an integrated device is coupled to or formed with the first element or the second element;
    forming a trench from a back surface of the first element opposite the front side of the first element, the trench extending through at least a portion of a thickness of the first element; and
    after forming the trench, disposing a getter material in the trench, the trench and the getter material extending around the integrated device.

17. The method of claim 16, further comprising plugging the trench after disposing the getter material.

18. The method of claim 17, wherein plugging the trench comprises plugging the trench with a polymer material.

19. The method of claim 16, wherein forming the trench comprising etching or drilling.

20. The method of claim 16, wherein the trench extends at least partially through a thickness of the second element from the front side of the second element.

21. The method of claim 16, further comprising defining a cavity between the first element and the second element, wherein the integrated device is disposed in the cavity.

22. The method of claim 16, wherein the getter material comprises aluminum.

23. The method of claim 16, wherein disposing the getter material comprises disposing the getter material on a floor and sidewalls of the trench.

24. The method of claim 16, wherein disposing the getter material comprises partially filling the trench with the getter material.

25. The method of claim 16, further comprising forming a plurality of trenches spaced apart from one another around the integrated device, the plurality of trenches including the trench.

26. The method of claim 16, wherein the getter material comprises tantalum.

27. The method of claim 16, wherein directly bonding comprises directly bonding a first nonconductive layer at the front side of the first element to a second nonconductive layer at the front side of the second element.

28. The method of claim 27, wherein directly bonding comprises directly bonding first conductive features at the front side of the first element to second conductive features at the front side of the second element.

29. The method of claim 28, wherein the first element comprises a substrate, the first nonconductive layer being disposed on the substrate, and wherein forming the trench comprises forming the trench to extend through the substrate.

30. The method of claim 29, further comprising forming the trench to extend into the second element.

31. The method of claim 16, wherein the integrated device is coupled to or formed with the first element, and wherein the second element comprises a processor die to process signals from the integrated device.

32. The bonded structure of claim 16, wherein the getter material substantially seals the integrated device from moisture in the outside environment.

33. The bonded structure of claim 16, wherein the getter material substantially seals the integrated device from gases in the outside environment.

* * * * *

UNITED STATES PATENT AND TRADEMARK OFFICE
CERTIFICATE OF CORRECTION

| | | |
|---|---|---|
| PATENT NO. | : 11,948,847 B2 | Page 1 of 1 |
| APPLICATION NO. | : 17/829185 | |
| DATED | : April 2, 2024 | |
| INVENTOR(S) | : Rajesh Katkar | |

It is certified that error appears in the above-identified patent and that said Letters Patent is hereby corrected as shown below:

In the Claims

In Column 13, Claim 32, Line 26, delete "bonded structure" and insert --method--.

In Column 13, Claim 33, Line 29, delete "bonded structure" and insert --method--.

Signed and Sealed this
First Day of October, 2024

Katherine Kelly Vidal
*Director of the United States Patent and Trademark Office*